(12) United States Patent
Cropper et al.

(10) Patent No.: US 6,623,608 B2
(45) Date of Patent: Sep. 23, 2003

(54) METHOD FOR MANUFACTURING AN INTEGRATED DISPLAY DEVICE INCLUDING AN OLED DISPLAY AND A TOUCH SCREEN

(75) Inventors: Andre D. Cropper, Rochester, NY (US); Ronald S. Cok, Rochester, NY (US); Rodney Feldman, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/072,547

(22) Filed: Feb. 8, 2002

(65) Prior Publication Data

US 2003/0150714 A1 Aug. 14, 2003

(51) Int. Cl.[7] .......................... C23C 14/00; B05D 5/06; B05D 1/36; B05D 7/00; C03C 17/04
(52) U.S. Cl. ........................ 204/192.22; 204/192.12; 427/163.3; 427/402; 427/419.2
(58) Field of Search ................. 204/192.1, 192.12, 204/192.15, 192.21, 192.22; 427/163.3, 402, 419.2

(56) References Cited

U.S. PATENT DOCUMENTS

| | | |
|---|---|---|
| 5,605,595 A | 2/1997 | Beeteson et al. ........... 156/295 |
| 5,739,479 A | 4/1998 | Davis-Cannon et al. ...... 178/19 |
| 5,795,430 A | 8/1998 | Beeteson et al. ........... 156/350 |
| 6,163,313 A | 12/2000 | Aroyan et al. .............. 345/173 |
| 6,495,198 B2 * | 12/2002 | Peng ........................... 427/66 |
| 2002/0149572 A1 * | 10/2002 | Schulz et al. ............... 345/174 |

OTHER PUBLICATIONS

USSN: 09/855,452, filed May 15, 2001 by Feldman.

USSN: 09/855,449, filed May 15, 2001 by Feldman et al.

USSN: 09/864,484, filed May 24, 2001 by Cok.

* cited by examiner

Primary Examiner—Steven H. VerSteeg
(74) Attorney, Agent, or Firm—Thomas H. Close

(57) ABSTRACT

A method of manufacturing a display device having two components, an OLED display formed on a film on one side of a substrate and a touch screen formed on a film on the other side of the substrate, the OLED display including components that are sensitive to high temperatures, includes the steps of: partially forming one of the components on one side of the substrate, applying a protector over the partially constructed component; forming the other component of the display device on the other side of the substrate; removing the protector; and completing the formation of the one component on the one side of the substrate.

19 Claims, 2 Drawing Sheets

METHOD FOR MANUFACTURING AN INTEGRATED DISPLAY DEVICE INCLUDING AN OLED DISPLAY AND A TOUCH SCREEN

FIELD OF THE INVENTION

The present invention relates to a method for the manufacture of resistive wire touch screens on flat-panel displays with a common substrate.

BACKGROUND OF THE INVENTION

Electronic devices typically include a computing engine, a display and an interactive device responsive to the input of a user. For example, a computer may include a computing circuit, a CRT for display, and a keyboard and mouse responsive to a user's input. As a second example, a Personal Digital Assistant includes a computing circuit, an LCD display, and a touch screen formed over the LCD display, together with some buttons. Many electronic devices, in particular mobile devices, miniature devices, devices that require a reprogrammable interface, or devices that require a robust and simple user interaction mechanism, rely upon touch screens placed over a display to provide user interaction capabilities to the device.

There are many touch screen technologies such as resistive wire, acoustic, and infra-red. These are generally placed above either a CRT screen or LCD screen to provide the required interactive functionality in a single component composed of two parts. Typically, the display (for example, LCD or CRT) is manufactured while the touch screen is made separately. After the display and touch screen are manufactured, they are integrated in a common housing to provide a single component that can be built into a complete electronic device.

Resistive wire touch screens are built upon a substrate that has coated upon it a resistive film, typically indium tin oxide (ITO) at a specified thickness, uniformity and resistivity. Resistive touch screen materials, such as spacers, conductive films, etc. are carefully formed upon the coated substrate to create a resistive touch screen. When combined with a display, the multi-layer component has inferior optical characteristics to the display device alone due to inter-layer reflections, has redundant manufacturing steps, and redundant components. Moreover, the additional step of integrating the components raises manufacturing costs for the complete device. The manufacturing processes for display-and-touch-screen devices are well known in the art and products are available today from a variety of vendors. For example, U.S. Pat. No. 5,795,430 issued Aug. 18, 1998 to Beeteson et al., describes an adhesive material dispensed onto a faceplate and used to attach a touch screen.

A new class of display devices based upon organic light-emitting diodes (OLEDs) is formed by depositing patterned conductive and organic materials upon a substrate. This substrate can be identical to the substrate used for resistive wire touch screens. Moreover, some of the materials used for the patterned conductive materials are similar to, or the same as, those used for the resistive films, but their uniformity, thickness and resistivity may vary. Passive matrix OLED displays are made by patterning a conductive material that is formed on a substrate. Active matrix OLED displays are typically made by patterning a conductive material on semiconducting materials comprising thin film transistor (TFT) circuitry. The TFTs are formed on a substrate. For an OLED display, the conductive material is ideally a low resistivity film, whereas for a touch screen a controlled higher resistivity film is employed. Once the conductive pattern is formed, organic materials are deposited, followed by any remaining conductive elements, planarization layers and other layers as known in the prior art. Connecting pads are defined as part of the conducting pattern and are wire-bonded to a cable after the device is encapsulated. The process by which the OLED display device is made uses well-known photo-lithographic, deposition, bonding, and encapsulation methods commonplace in the integrated circuit industry. However, a problem exists with the conventional practice of forming separate OLED displays and touch screens and then combining them with a conventional mount, in that the additional layers in the touch screen reduce the brightness of the display, reduces the optical quality of the display due to additional internal reflections from the layers of the touch screen, and add cost due to the need for two substrates and a complex housing for the two elements.

There is a need therefore for an improved method for manufacturing an integrated resistive touch screen and OLED display that reduces redundant components in the devices, reduces cost, improves optical qualities, and is more robust.

SUMMARY OF THE INVENTION

The need is met according to the present invention by providing a method of manufacturing a display device having two components, an OLED display formed on a film on one side of a substrate and a touch screen formed on a film on the other side of the substrate, the OLED display including components that are sensitive to high temperatures, that includes the steps of; partially forming one of the components on one side of the substrate; applying a protector over the partially constructed component; forming the other component of the display device on the other side of the substrate; removing the protector, and completing the formation of the one component on the one side of the substrate.

ADVANTAGES

The present invention has the advantage that it reduces the number of components required to build an integrated OLED display and resistive touch screen device, reduces the number of manufacturing steps, reduces the manufacturing costs, reduces the combined size of the display and touch screen device, and provides superior optical performance.

DETAILED DESCRIPTION OF THE INVENTION

Figure 1:
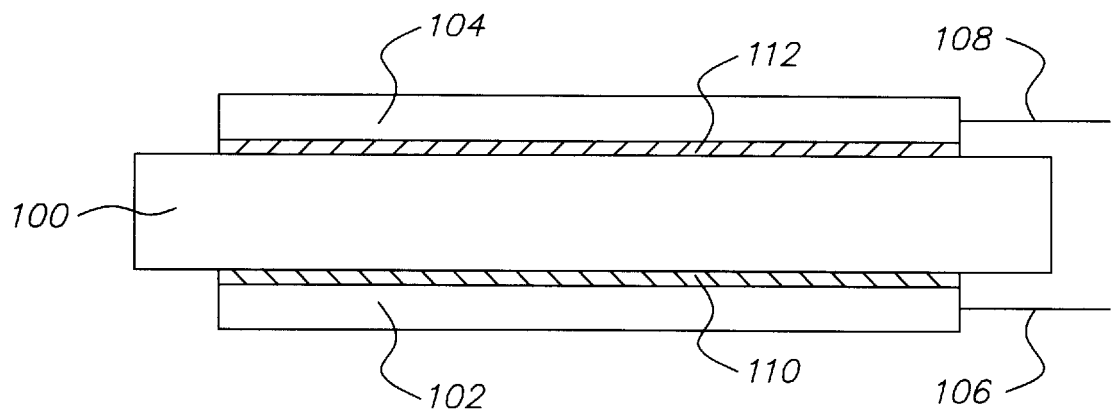
FIG. 1 is a schematic side view of an integrated display device that can be manufactured according to the present invention.

Referring to FIG. 1, a substrate 100 (typically glass or rigid polymer) having two parallel flat sides is used both for an OLED display 102 and a resistive touch screen 104. The OLED display 102 emits light through the substrate 100 and the resistive touch screen 104. The OLED display 102 is formed on a conductive film 110 that is patterned to provide conductors as is known in the art. For passive matrix OLED displays, the conductive film is formed directly on substrate 100. For active matrix OLED displays, the conductive film is formed on thin film transistor (TFT) circuitry, where the TFT circuitry was previously formed on the substrate 100. The resistive touch screen 104 is formed on a uniform resistive film 112 as is known in the art. As used herein conductive film refers to a film that will be subsequently patterned to form conductors in an OLED device and resistive film refers to a film that will be employed in a resistive touch screen. It will be understood that the conductive and resistive films may be similar materials formed by similar methods, with the materials or forming methods being varied to produce higher or lower conductivity in the films as required by the application. Connectors 106 and 108 are provided to the OLED display 102 and touch-screen 104 respectively for driving the display and receiving inputs from an operator of the display.

Conventionally, the resistive/conductive film, usually indium tin oxide (ITO), is formed using a high temperature (e.g. 200° C. and higher). If OLED materials are subjected to such high temperatures, their performance (life time, stability, color characteristics) can be adversely affected. Thus, it is preferable that any high temperature resistive/conductive film deposition steps be performed prior to the deposition of any OLED materials. In making a flat panel display and a touch screen on a common substrate, one possible approach is to perform the high temperature deposition steps for both the OLED display and the touch screen prior to deposition of the OLED materials. Unfortunately, conventional handling equipment used to manufacture OLED flat panel displays and touch screens contact the substrate from the back side, potentially causing damage to any previously formed resistive film layers. Furthermore, if an entire touch screen were to have been previously formed on one side of the substrate, the handling equipment used to make the OLED display would not function properly.

Figure 3:
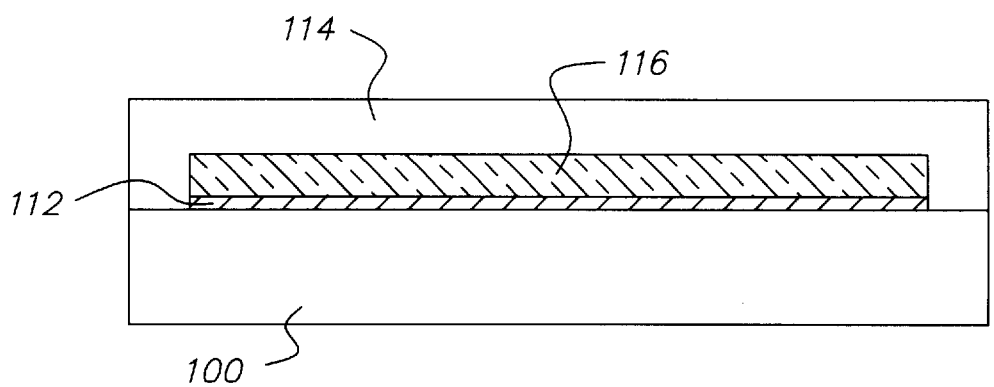
FIG. 3 is a schematic side view of a protector employed according to one embodiment of the present invention.
Figure 2:
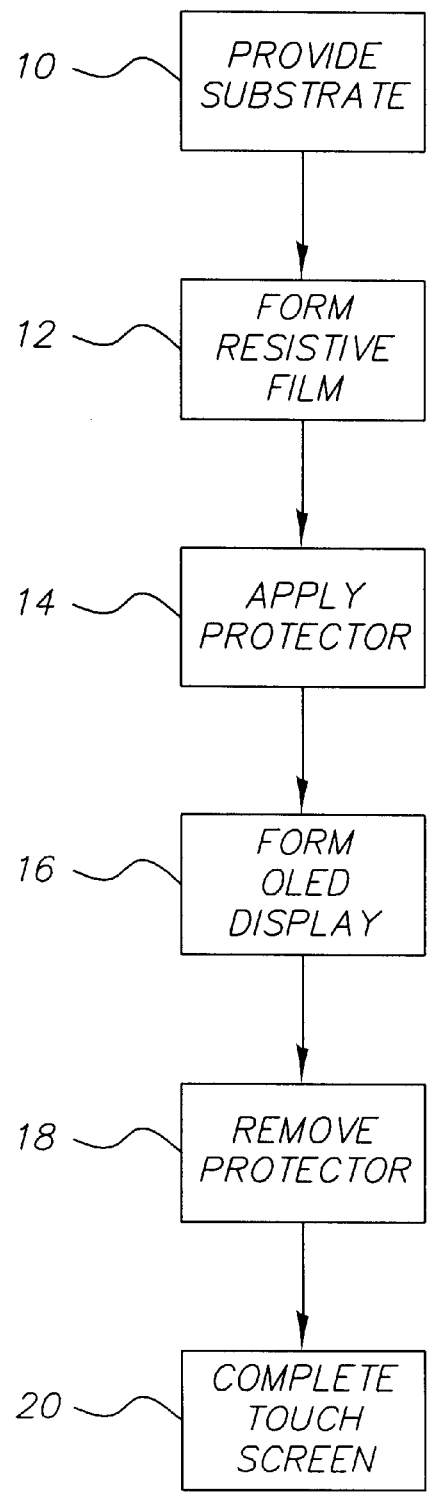
FIG. 2 is a flow chart showing the manufacturing steps of the present invention.

Referring to FIG. 2, according to one embodiment of the present invention, a clean transparent substrate having two parallel sides is provided 10. A resistive film is formed 12 on a first side of the substrate using any conventional technique, including but not limited to, high temperature sputtering. Next, a protector, such as a layer of silicon dioxide or photoresist is applied 14 over the resistive film on the first side of the substrate. Referring to FIG. 3, alternatively, a thin, flat protective device 114 having similar properties to the substrate may be affixed to the substrate 100 over the resistive layer 112 with a removable adhesive to protect it. For example, a reusable glass cover plate with a cavity 116 provided on one side may be used to protect the resistive material.

Returning to FIG. 2, an OLED display is then formed 16 on the opposite side of the substrate. Since OLED materials have not yet been deposited on the substrate, the conventional process of forming the OLED display can be employed. For passive matrix devices a conductive ITO film is deposited using a high temperature sputtering technique. For active matrix devices, semiconducting materials are formed and patterned on the OLED display side of the substrate, followed by a conductive ITO film using a high temperature sputtering technique. After the conductive ITO film is formed, for either passive or active matrix OLEDs, the OLED materials are deposited and patterned using low temperature techniques. Once the OLED display is completed, the protector is removed 18 and the touch screen 104 is completed 20 over the resistive layer 112.

Alternatively, the conductive film for passive matrix OLED displays may be formed first and protected; the touch sensitive screen formed on the other side, the protector removed; and finally the OLED display completed.

According to a further alternative embodiment of the present invention, the conductive film for a passive matrix OLED display is first formed and patterned, and all subsequent steps prior to deposition of the organic materials are completed. The protector is then applied over the partially completed OLED display. The touch sensitive screen is then formed on the other side of the substrate, including the deposition of a resistive film. The protector is then removed and the OLED display is completed.

According to a further alternative embodiment of the present invention, the thin film transistor circuitry and the conductive film for an active matrix OLED display are first formed and patterned, and all subsequent steps prior to deposition of the organic materials are completed. The protector is then applied over the partially completed OLED display. The touch sensitive screen is then formed on the other side of the substrate, including the deposition of a resistive film. The protector is then removed and the OLED display is completed.

The invention has been described in detail with particular reference to certain preferred embodiments thereof, but it will be understood that variations and modifications can be effected within the spirit and scope of the invention.

PARTS LIST

10 providing substrate step
12 form resistive film step
14 apply protector step
16 form OLED display step
18 remove protector step
20 complete touch screen step
100 substrate
102 OLED display
104 touch screen
106 connector
108 connector
110 conductive film
112 resistive film
114 protector
116 cavity

What is claimed is:

1. A method of manufacturing a display device having two components, an OLED display formed on a film on one side of a substrate and a touch screen formed on a film on the other side of the substrate, the OLED display including components that are sensitive to high temperatures, comprising the steps of:

a) partially forming one of the components on one side of the substrate;

b) applying a protector over the partially formed component;

c) forming the other component of the display device on the other side of the substrate;

d) removing the protector; and e) completing the formation of the one component on the one side of the substrate.

2. The method claimed in claim 1, wherein the one component is the OLED display.

3. The method claimed in claim 2, wherein the step of partially forming comprises the step of forming a conductive film.

4. The method claimed in claim 3, wherein the step of forming a film is a sputtering process.

5. The method claimed in claim 3, wherein the conductive film is indium tin oxide (ITO).

6. The method claimed in claim 2, wherein the OLED display is an active matrix OLED display.

7. The method claimed in claim 6, wherein the step of partially forming comprises the step of forming thin film transistor circuitry and a conductive film.

8. The method claimed in claim 7, wherein the step of partially forming further comprises all of the steps of forming the OLED display prior to depositing OLED materials.

9. The method claimed in claim 1, wherein the step of partially forming comprises all of the steps of forming the OLED display prior to depositing OLED materials.

10. The method claimed in claim 1, wherein the one component is the touch screen.

11. The method claimed in claim 10, wherein the step of partially forming the touch screen comprises the step of forming a resistive film.

12. The method claimed in claim 11, wherein the film is ITO.

13. The method claimed in claim 11, wherein the step of forming a film is a sputtering process.

14. The method claimed in claim 11, wherein the film is ITO.

15. The method claimed in claim 1 wherein the display device is an active-matrix display device.

16. The method claimed in claim 1, wherein the protector is a layer of silicon dioxide.

17. The method claimed in claim 1, wherein the protector is a layer of photo-resist.

18. The method claimed in claim 1, wherein the protector is a cover plate defining a cavity.

19. The method claimed in claim 1 wherein the display device is a passive-matrix display device.

* * * * *